United States Patent
Hur et al.

(10) Patent No.: US 9,419,561 B2
(45) Date of Patent: Aug. 16, 2016

(54) CIRCUITS AND METHODS FOR BIASING A POWER AMPLIFIER

(71) Applicant: QUALCOMM Incorporated, San Diego, CA (US)

(72) Inventors: Joonhoi Hur, San Diego, CA (US); Paul Joseph Draxler, San Diego, CA (US)

(73) Assignee: QUALCOMM, Incorporated, San Diego, CA (US)

(*) Notice: Subject to any disclaimer, the term of this patent is extended or adjusted under 35 U.S.C. 154(b) by 0 days.

(21) Appl. No.: 14/248,971

(22) Filed: Apr. 9, 2014

(65) Prior Publication Data
US 2015/0295541 A1    Oct. 15, 2015

(51) Int. Cl.
  *H03F 3/68*   (2006.01)
  *H03F 1/02*   (2006.01)
  *H03F 3/193*  (2006.01)

(52) U.S. Cl.
  CPC ............ *H03F 1/0288* (2013.01); *H03F 1/0227* (2013.01); *H03F 1/0266* (2013.01); *H03F 3/193* (2013.01); *H03F 2200/18* (2013.01); *H03F 2200/451* (2013.01)

(58) Field of Classification Search
  CPC .......... H03F 3/68; H03F 3/191; H03F 1/0288
  USPC ......... 330/295–297, 124 R, 84, 53, 136, 302, 330/144
  See application file for complete search history.

(56) References Cited

U.S. PATENT DOCUMENTS

| | | | |
|---|---|---|---|
| 5,739,723 A | 4/1998 | Sigmon et al. | |
| 7,135,931 B2* | 11/2006 | Prodanov | 330/302 |
| 8,269,559 B2 | 9/2012 | Tadano | |
| 8,604,881 B2* | 12/2013 | Sankalp et al. | 330/295 |
| 2007/0075780 A1 | 4/2007 | Krvavac et al. | |
| 2008/0122542 A1 | 5/2008 | Bowles et al. | |
| 2011/0183636 A1 | 7/2011 | Staudinger et al. | |

FOREIGN PATENT DOCUMENTS

| | | |
|---|---|---|
| EP | 2372905 A1 | 10/2011 |
| WO | 2008013481 A1 | 1/2008 |
| WO | 2013055170 A1 | 4/2013 |

OTHER PUBLICATIONS

Lee et al. ("Highly Linear Power Tracking Doherty Amplifier for WCDMA Repeater Applications", IEEE Microwave and Wireless Components Letters, vol. 18, No. 7, Jul. 2008, pp. 485-487).*

(Continued)

*Primary Examiner* — Steven J Mottola
*Assistant Examiner* — Hafizur Rahman
(74) *Attorney, Agent, or Firm* — Fountainhead Law Group P.C.

(57) ABSTRACT

The present disclosure includes circuits and methods for power amplifiers. In one embodiment, a main amplifier stage and peaking amplifier stage of a power amplifier receive a modulated supply voltage. The peaking amplifier stage is biased dynamically to adjust the bias of peaking stage to compensate for changes in the power supply voltage. A bias voltage may be increased as the supply voltage on the peaking stage decreases, and the bias voltage may be decreased as the supply voltage on the peaking stage increases. Accordingly, bias characteristics of the peaking stage are maintained across supply voltage variations, and the efficiency of the power amplifier is improved.

26 Claims, 9 Drawing Sheets

(56) References Cited

OTHER PUBLICATIONS

Yang Y., et al., "A Microwave Doherty Amplifier Employing Envelope Tracking Technique for High Efficiency and Linearity," IEEE Microwave and Wireless Components Letters, Sep. 2003, vol. 13 (9), pp. 370-372.

Zhao, Y., et al., "Doherty Amplifier with DSP Control to Improve Performance in CDMA Operation," 2003 IEEE MTT-S International Microwave Symposium Digest, 2003, vol. 2, pp. 687-690.

"Doherty amplifier with cooperative power tracking and bias adaption for high efficiency", Research Disclosure, Mason Publications, Hampshire, GB, vol. 578, No. 37, Jun. 1, 2012, p. 453, XP007141360, ISSN: 0374-4353 p. 12-p. 15; figures 3-1 figures 3-2 figures 3-3 figures 3-4.

International Search Report and Written Opinion—PCT/US2015/024821—ISA/EPO—Jul. 1, 2015.

Lee Y., et al., "Highly Linear Power Tracking Doherty Annplifierfor WCDMA Repeater Applications", IEEE Microwave and Wireless Components Letters, IEEE Service Center, New York, NY, US, vol. 18, No. 7, Jul. 1, 2008, pp. 485-487, XP011347424, ISSN: 1531-1309, DOI: 10.1109/LMWC.2008.925113 p. 485, right-hand column—p. 486, right-hand column; figures 1,4.

* cited by examiner

CIRCUITS AND METHODS FOR BIASING A POWER AMPLIFIER

BACKGROUND

The present disclosure relates to electronic circuits and methods, and in particular, to amplifier bias circuits and methods.

Wireless systems typically include a transmitter and receiver coupled to an antenna to send and receive RF signals. Generally, a baseband system generates a digital signal that includes encoded information (data), and the digital signal is converted to an analog signal for transmission. The analog signal is processed and typically modulated (up converted) to an RF carrier frequency. After up conversion, the RF signal is coupled to an antenna through a power amplifier. The power amplifier increases the signal power so that the RF signal can communicate with a remote system, such as a base station, for example.

Wireless systems require power amplifiers that can transmit RF signals with a considerable range of instantaneous and average signal power levels. Generally, power amplifiers are sized and designed such that the optimal efficiency is only at the maximum instantaneous output power, resulting in a significant reduction in efficiency for dynamic signals. As such, advanced architectures that provide higher efficiency at output power levels other than the maximum instantaneous output power are sought.

SUMMARY

The present disclosure includes circuits and methods for biasing power amplifiers. The present disclosure includes circuits and methods for power amplifiers. In one embodiment, a main amplifier stage and peaking amplifier stage of a power amplifier receive a modulated supply voltage. The peaking amplifier stage is biased dynamically to adjust the bias of peaking stage to compensate for changes in the power supply voltage. A bias voltage may be increased as the supply voltage on the peaking stage decreases, and the bias voltage may be decreased as the supply voltage on the peaking stage increases. Accordingly, bias characteristics of the peaking stage are maintained across supply voltage variations, and the efficiency of the power amplifier is improved.

The following detailed description and accompanying drawings provide a better understanding of the nature and advantages of the present disclosure.

DETAILED DESCRIPTION

The present disclosure pertains to biasing power amplifiers. In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples alone or in combination with other features described below, and may further include modifications and equivalents of the features and concepts described herein.

Figure 1:
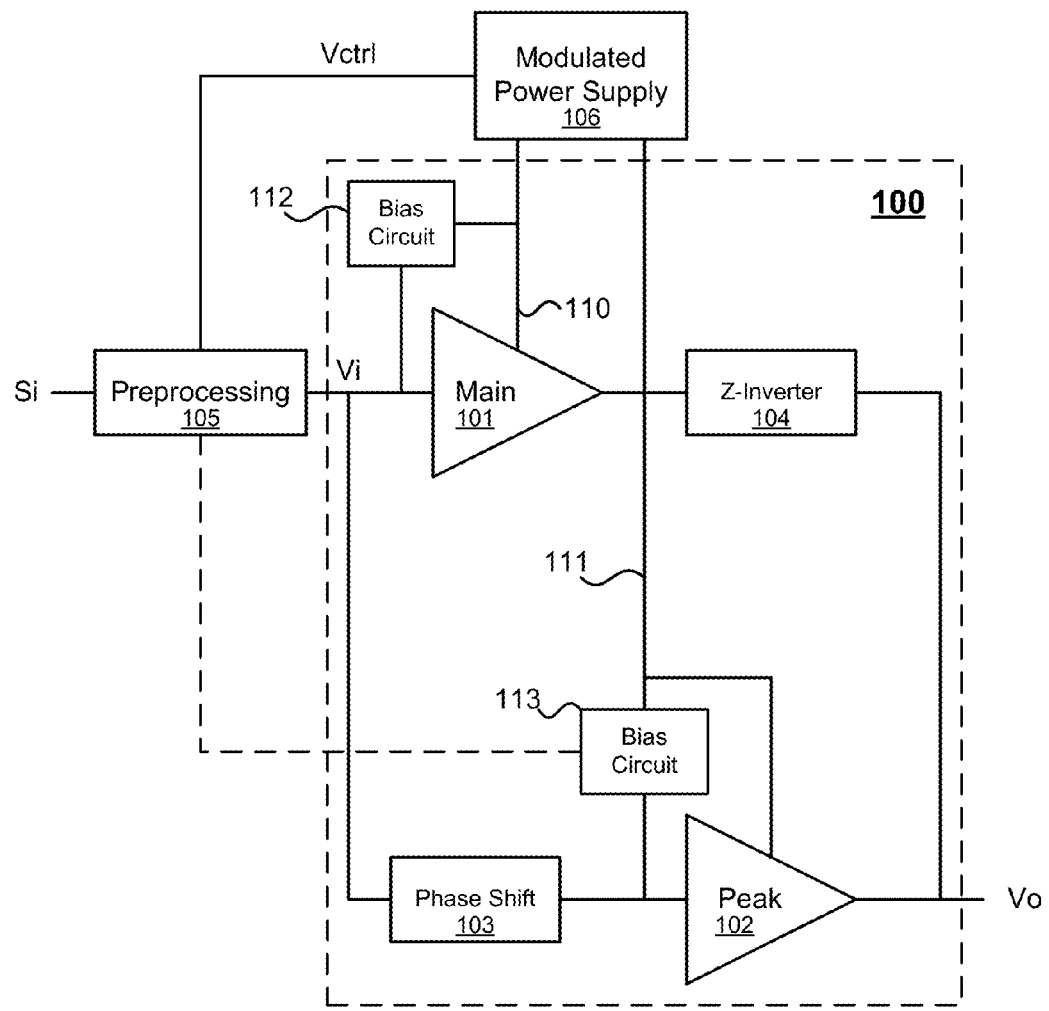
FIG. 1 illustrates a power amplifier and biasing circuit according to one embodiment.

FIG. 1 illustrates a power amplifier and biasing circuit according to one embodiment. Embodiments of the present disclosure include a power amplifier 100 comprising a main (or carrier) amplifier stage 101 and a peaking (or auxiliary) amplifier stage 102. An output of the peaking amplifier stage 102 is coupled to an output of the main amplifier stage 101 through an impedance inverter circuit 104, which may be implemented as a quarter-wave transmission line, for example. The output of the peaking amplifier stage 102 is coupled to an output terminal of power amplifier 100. An RF input signal, Vi, is received at an input of the main amplifier stage 101. Power amplifier 100 may be a radio frequency (RF) power amplifier configured to drive an antenna (not shown). An RF input signal Vi is also coupled to the input of peaking amplifier stage 102 through a quarter wave phase shift circuit 103, for example. Power amplifier 100 produces an output voltage, Vo, on the output terminal, which may be coupled to an antenna.

Example embodiments according to FIG. 1 may include a Doherty amplifier. Doherty amplifiers demonstrate high efficiency over a wide output power range. In some embodiments, the main amplifier stage may be class A, AB, or B, and the peaking amplifier stage may be class C, F, or another switch mode power amplifier, for example. Switch mode power amplifiers are normally off when receiving a small input signal below some threshold, and only produce an output when a sufficiently high input drive level is received. The peaking amplifier stage may be off for small signal amplitudes and may turn on for larger signal amplitudes. For example, the main amplifier may be biased class A or class AB and the peaking amplifier may be biased at class C so that the peaking amplifier turns on when the input power is above a threshold (e.g., just before the main amplifier starts to go into compression). Features and advantages of the present disclosure include a bias circuit for biasing the peaking amplifier stage to improve efficiency of the amplifier, for example.

Main amplifier stage 101 and peaking amplifier stage 102 include power supply terminals 110 and 111, respectively, that are coupled to a modulated power supply circuit 106. The power supply voltages provided to the power supply terminals of the main and peaking amplifiers may change over time to improve the efficiency of the power amplifier. Accordingly, such varying power supply voltages are referred to as dynamic power supply voltages, and may change between different discrete voltage levels or vary continuously. Examples of dynamic power supply circuits used in power amplifiers are described in U.S. patent application Ser. No. 14/088,321, filed on Nov. 11, 2013, naming Joonhoi Hur and Paul J. Draxler as inventors, the contents of which are hereby incorporated herein by reference.

Power supply 106 may change the power supply voltage to either or both of the main and peaking amplifiers based on one or more control signals, Vctrl, for example. As illustrated in FIG. 1, an input signal Si may be received in a preprocessing block 105, such as a predistortion block, and the control signal Vctrl may change the power supply voltage(s) provided to either or both of the main and peaking amplifiers based on the characteristics of the signal to be transmitted (e.g., Vo) to improve the efficiency of the amplifier.

Embodiments of the present disclosure improve biasing of the peaking amplifier stage 102 driven by a dynamic power supply. For example, main amplifier 101 may be biased by a bias circuit 112 and peaking amplifier 102 may be biased by a bias circuit 113. In this example, power supply terminal 111 is coupled to an input of bias circuit 113. An output of bias circuit 113 is coupled to an input of peaking amplifier 102.

Embodiments of the present disclosure include a bias circuit that changes a bias voltage as the power supply voltage to the peaking amplifier changes. For example, a power supply voltage on power supply terminal 111 of peaking amplifier 102 may vary across a range over time. The range may have a highest voltage value and a lowest voltage value, for example. Example embodiments of bias circuit 113 may receive the power supply voltage on terminal 111 and produce a bias voltage that is lower when the power supply voltage is high and higher when the power supply voltage is low. In other words, bias circuit 113 produces a bias voltage to the peaking amplifier that increases as a voltage on the power supply terminal 111 decreases. In some example embodiments, the bias voltage may be changed to maintain the bias point of the peaking amplifier so that appropriate peaking occurs as the power supply voltage and maximum output power changes over time. While the configuration shown in FIG. 1 illustrates an embodiment where bias circuit 113 is coupled directly to the power supply voltage, other embodiments may control the bias circuit 113 using signals produced by other circuit blocks. In one embodiment, upstream circuits, such as pre-processing circuit 105 may produce a control signal (shown using a dashed line) to the bias circuit 113 to modulate a bias voltage on the peaking amplifier 102 as described herein.

Figure 2:
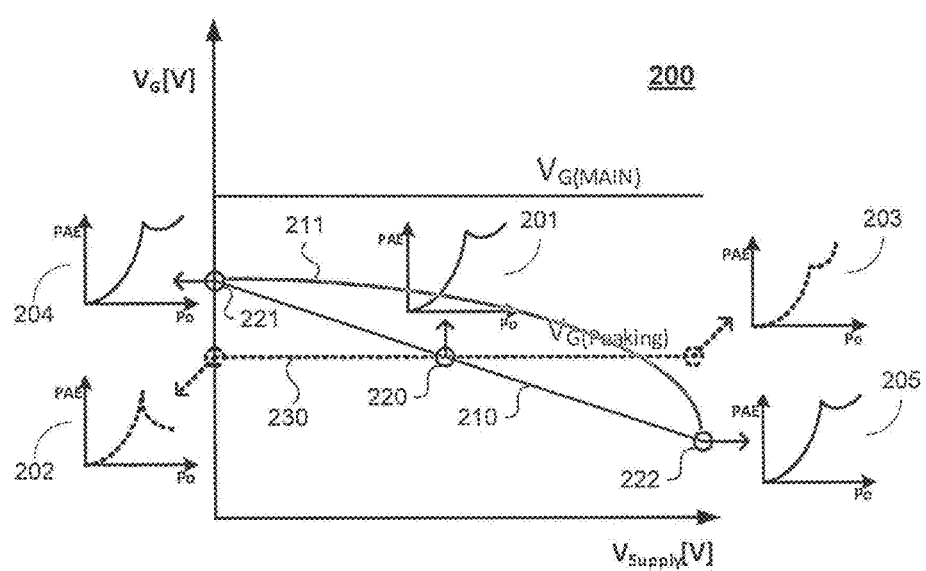
FIG. 2 illustrates one example of a bias voltage to a peaking amplifier that varies with the supply voltage.

FIG. 2 is a plot 200 of a bias voltage to a peaking amplifier that varies with the supply voltage. Plot 201 in FIG. 2 illustrates power amplifier efficiency (PAE) versus instantaneous output signal power (Po) for a Doherty amplifier at a particular power supply voltage Vsupply and bias voltage Vg corresponding to point 220. A peak efficiency of 0 dB for a Doherty amplifier typically occurs at a maximum output signal power, Po. As the normalized instantaneous output signal power is reduced at a particular supply and bias voltage, the efficiency (e.g., PAE) of the amplifier changes. As illustrated in plot 201, there is a first PAE peak at a maximum output power and a second PAE peak at a second output power below the maximum (e.g., in this example, about −6 dB below the maximum). The region between the efficiency peaks forms a plateau, where the efficiency of the power amplifier is very high for output powers across this range. In this example, PAE is approximately flat from a first PAE peak at a maximum output power down to a second PAE peak at about −6 dB from the maximum output power. Below the maximum output power by more than −6 dB, the efficiency decreases as the output power decreases.

However, if the supply voltage varies, the peaks may shift and the characteristic PAE curve may change based on the bias of the peaking amplifier. In particular, in a Doherty amplifier it is desirable to have the peaking amplifier stage turn on about 6 dB below maximum output power for the particular supply voltage. Some applications may vary the 6 dB window under different operating conditions, so references herein to the 6 dB window are to be understood as merely examples of more general Doherty peaks separated by XdB, where X is an arbitrary number of dB.

Without proper biasing, the peaking amplifier in a Doherty may turn on late with respect to the 6 dB point (i.e., at too high a power level) at low supply voltages. For instance, if the supply voltage drops, the conduction angle for a class C amplifier may be too small, which may cause it to turn on at −5 dB or −4 dB (e.g., too late relative to a −6 dB peak) from the maximum output power. Similarly, the peaking amplifier may turn on early (i.e., at too low a power level) at high supply voltage levels. For instance, if the supply voltage increases, the conduction angle for a class C amplifier may become too large, which may cause it to turn on at −7 dB, −8 dB, or −9 dB (e.g., too early relative to a −6 dB peak) from the maximum output power. Plot 200 in FIG. 2 illustrates Doherty PAE curves for a peaking amplifier with constant bias voltage across a range of supply values. If the bias is held constant, as illustrated at line 230, the maximum output power PAE peak in the Doherty PAE curve drops as the supply voltage is reduced as shown in plot 202. Similarly, the −6 dB PAE peak in the Doherty PAE curve drops as the supply voltage is increased as shown in plot 203.

As mentioned above, embodiments of the present disclosure include a bias circuit that changes the bias of the peaking amplifier based on the supply voltage to the peaking amplifier. FIG. 2 illustrates an example where the bias voltage Vg is increased linearly (at line 210) as the supply voltage decreases. As shown in plots 204 and 205, the characteristic Doherty PAE curve can be maintained by increasing the bias voltage at lower supply voltages (plot 204 corresponding to bias and supply voltages at 221) and by reducing the bias voltage at higher supply voltages (plot 205 corresponding to bias and supply voltages at 222). As further illustrated in plot 200 in FIG. 2, other embodiments may change the bias voltage based on supply voltage according to a different (non-linear) function. FIG. 2 illustrates another curve 211 that forms another example relationship between supply voltage and peaking amplifier bias voltage. Example curve 211 illustrates that the bias voltage to the peaking amplifier monotonically increases as the supply voltage decreases. Those of ordinary skill in the art having read the present disclosure will understand that a variety of different bias voltage/power supply voltage curves could be used to maintain high efficiency in a Doherty amplifier based on the particular structure and design of the peaking amplifier.

Figure 3A:
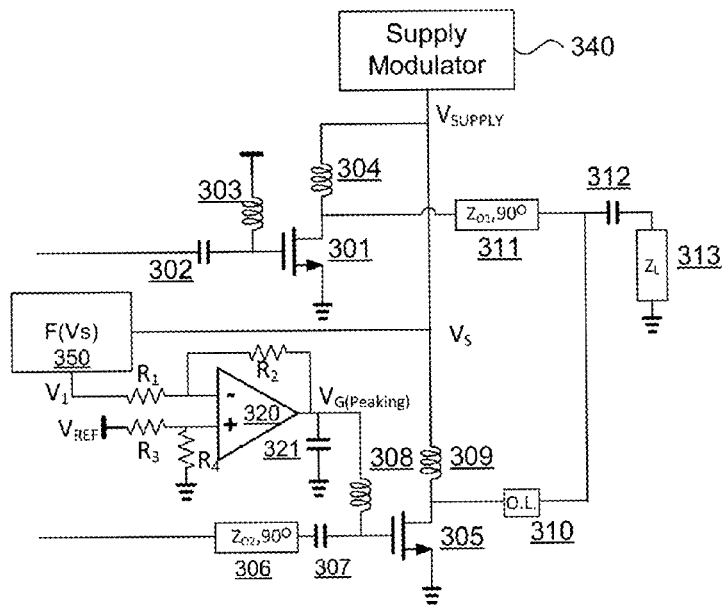
FIG. 3A illustrates another example power amplifier and bias circuit according to another embodiment.

FIG. 3A illustrates another example power amplifier 300 and bias circuit according to another embodiment. Power amplifier 300 includes a supply modulator 340 for generating a modulated power supply, Vsupply. Power amplifier 300 further includes a main amplifier stage including transistor 301 having a control terminal coupled to receive an input signal through capacitor 302. The control terminal is biased by a reference voltage through inductor 303, for example. A source of transistor 301 is coupled to ground and a drain is coupled to Vsupply through choke inductor 304.

Power amplifier 300 further includes a peaking amplifier stage including transistor 305 having a control terminal coupled to receive an input signal through quarter wave shift circuit 306 and capacitor 307. The control terminal is biased by a bias circuit through inductor 308, for example. A source of transistor 305 is coupled to ground and a drain is coupled to Vsupply through choke inductor 309. An output of the peaking stage at the drain of transistor 305 is coupled to the output of the main stage at the drain of transistor 301 through output load (OL) 310 and impedance inverter circuit 311. The output of the peaking stage is also coupled to a load 313 (e.g., an antenna and possibly other circuitry) through capacitor 312, for example.

In the present example, transistors 301 and 305 are MOS devices, but it is to be understood that other devices such as GaAs (gallium arsenide), bipolar, or other device types may be used.

In one embodiment, a bias circuit comprises a subtractor circuit. In this example implementation, the subtractor circuit includes an amplifier 320 having a negative input terminal coupled to Vsupply through resistor R1 and functional circuit 350 ("F(Vs)"). An output of amplifier 320 is coupled to the negative input through a feedback resistor R2. A positive input terminal is coupled to a reference voltage Vref through resistor R3 and to ground through resistor R4. In some embodiments, Vref may be modulated as well (e.g., according to the same modulation as Vsupply). The amplifier produces bias voltage Vg (peaking) on capacitor 321 and to one terminal of inductor 308. At low frequencies, inductor 308 is a short circuit, and Vg (peaking) is coupled to the gate of transistor 305 to set the bias on the peaking stage.

Functional circuit 350 may be used to control the relationship between bias voltage Vg (peaking) and Vsupply. In one example, circuit 350 may be a short circuit so that the bias voltage is approximately linearly related to Vsupply. In other embodiments, functional circuit 350 may produce other functional relations between Vsupply and V1, which is provided to the subtractor circuit. For example, functional circuit may cause V1 to be Vsupply squared (e.g., "V1=(Vsupply)$^2$"). As another example, functional circuit 350 may cause V1 to be a polynomial of Vsupply (e.g., "V1=Vsupply+A(Vsupply)$^2$," where A is a constant).

For the linear example, bias circuit subtracts a value proportional to Vsupply from another value proportional to Vref. Thus, when Vsupply is large, the output voltage is low, and as Vsupply decreases, the amount subtracted from Vref decreases and the bias voltage increases. The bias circuit in FIG. 3 is one example implementation that may be used to produce a linearly changing bias voltage as shown in FIG. 2. Based on the present disclosure, it is to be understood that a variety of other subtraction circuits could be used to vary the bias voltage on a peaking amplifier to improve efficiency of the power amplifier.

Figure 3B:
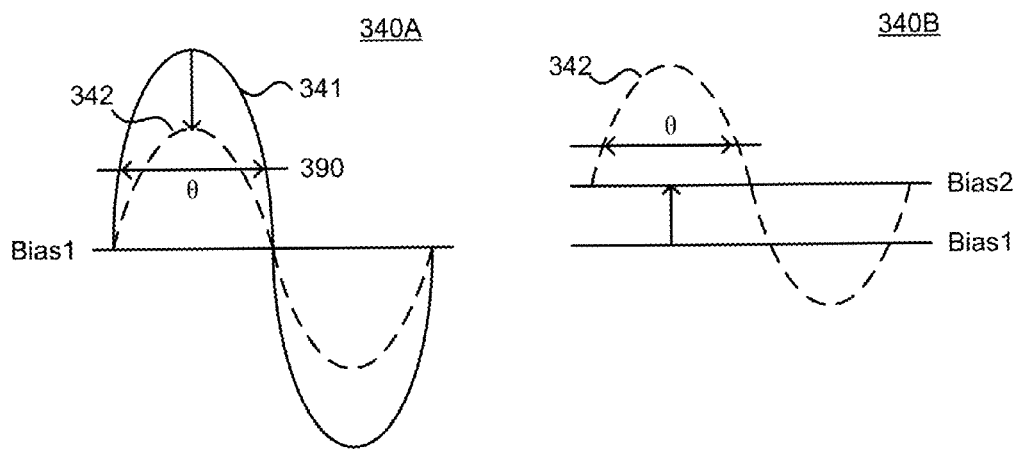
FIG. 3B illustrates input signals to the peaking amplifier for different supply voltages.
Figure 4A:
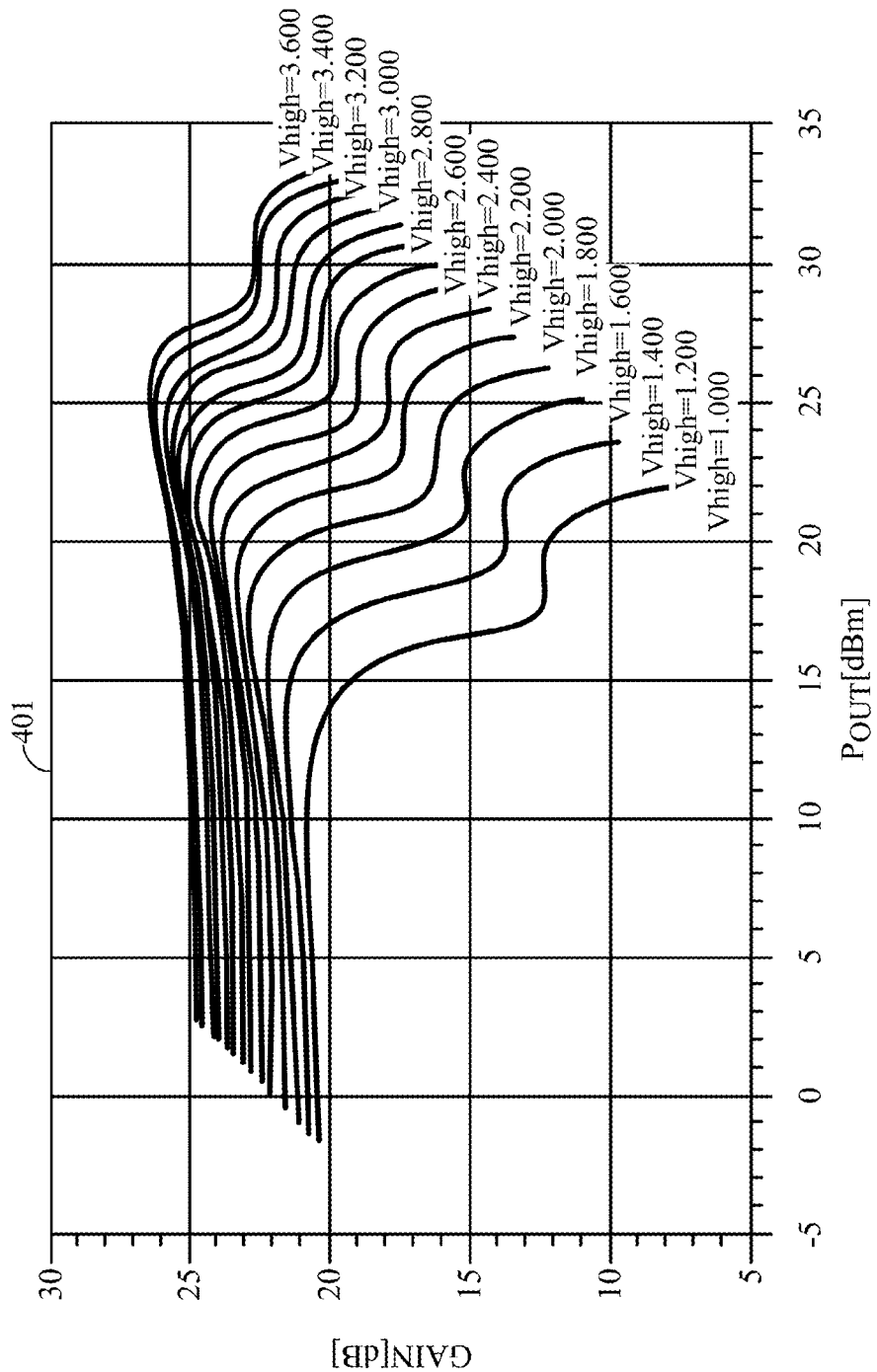
FIG. 4A-D illustrate performance curves for an example power amplifier according to one embodiment.
Figure 4B:
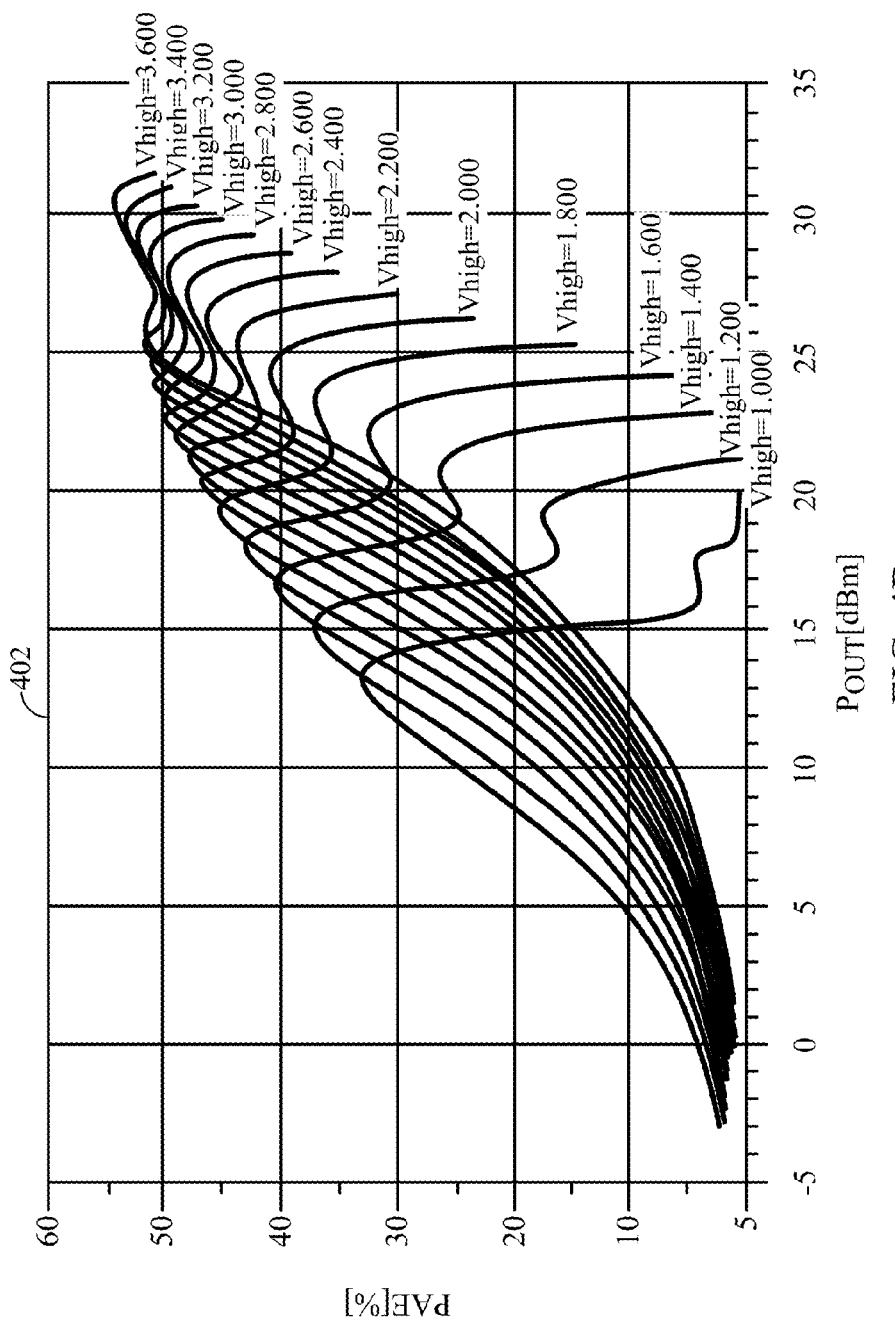
Figure 4C:
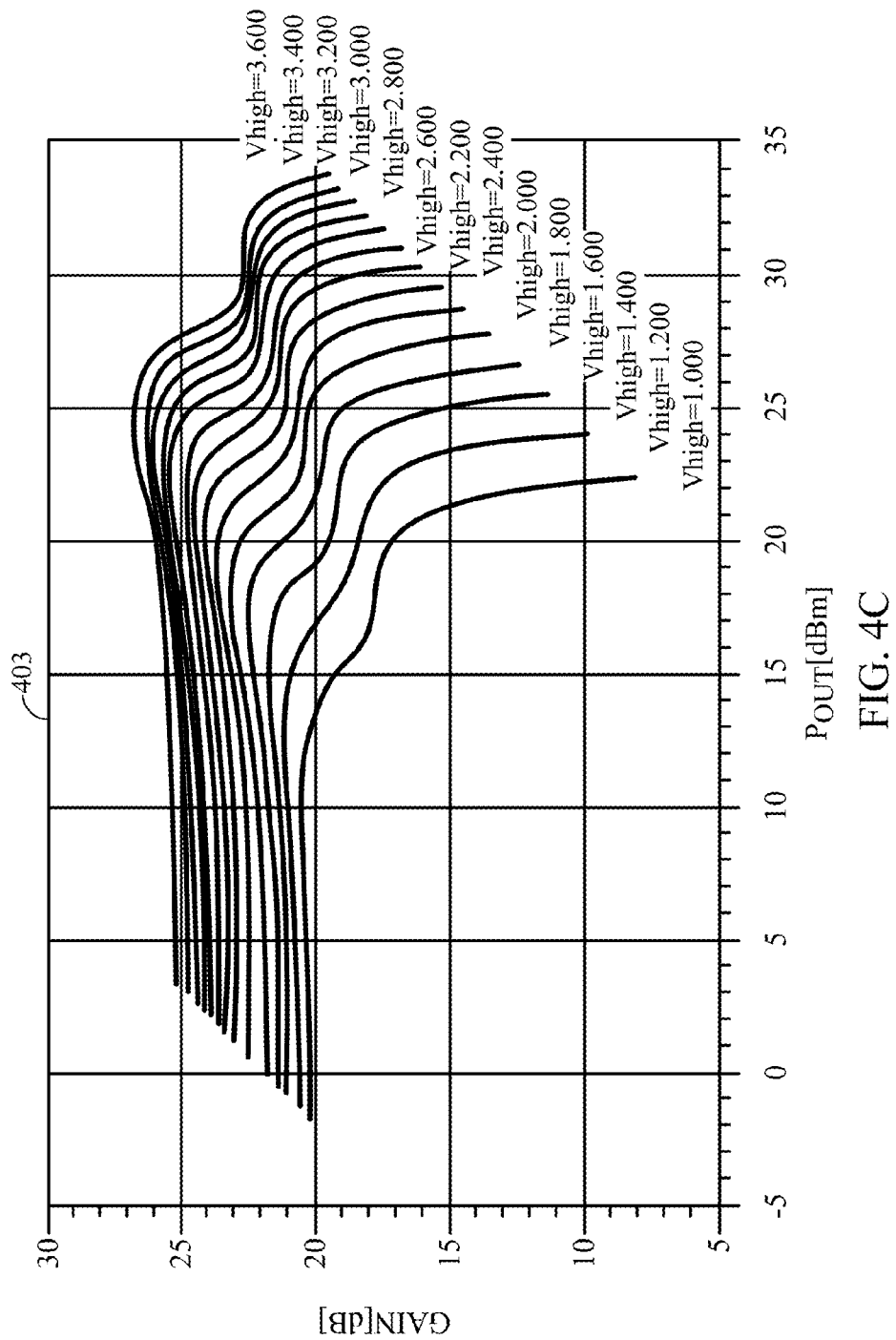
Figure 4D:
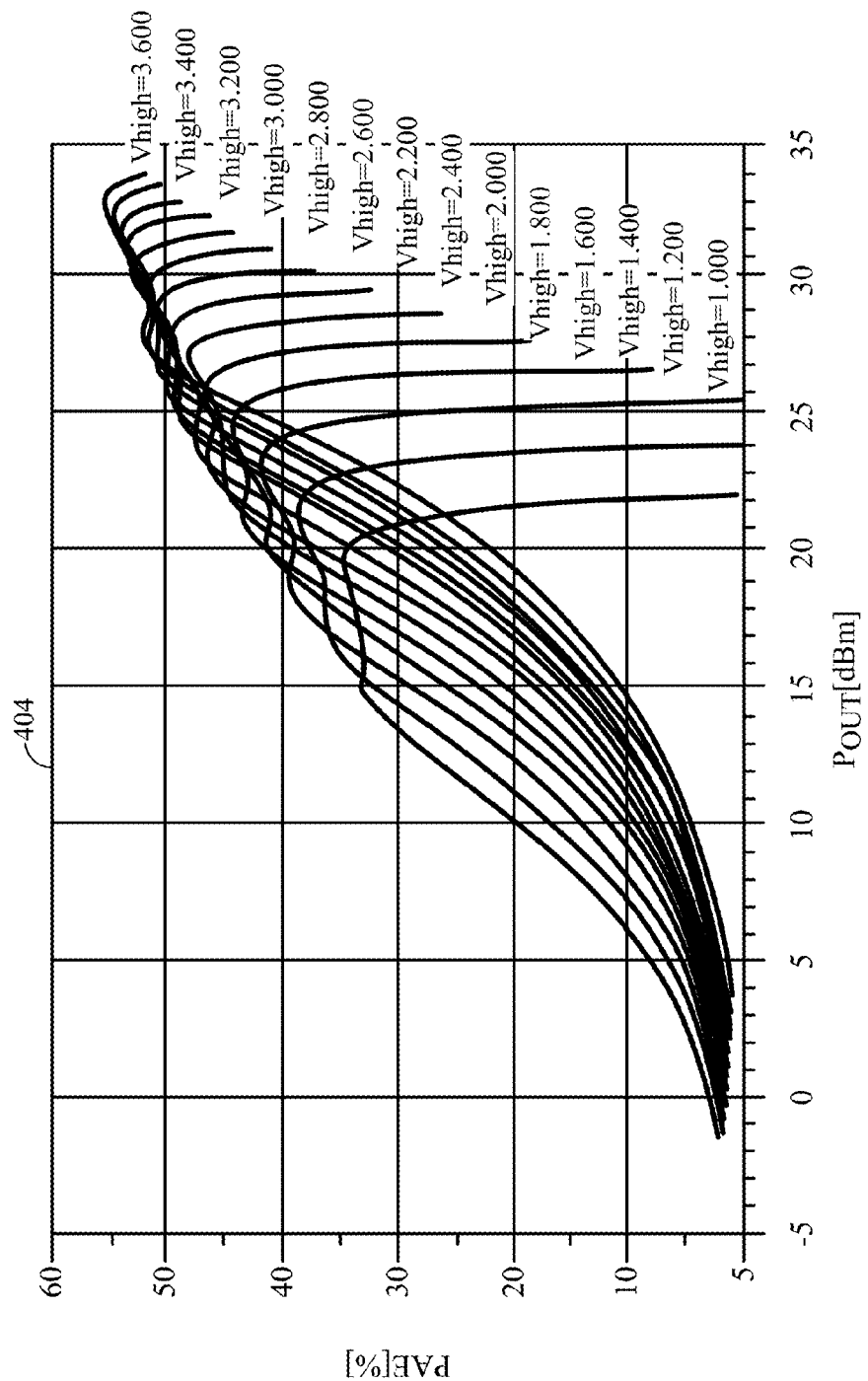

FIG. 3B illustrates input signals to the peaking amplifier for different supply voltages. Transistor 305 may be biased just below conduction (e.g., off) so that only input signals with a voltage above a particular threshold may produce an output. Plot 340A illustrates an input voltage signal 341 to a peaking amplifier at a first supply voltage for maximum output power and an input voltage signal 342 to the peaking amplifier for a lower output power at a lower supply voltage. At maximum power, the peaking amplifier is biased at a first bias level, BIAS1, so that the peaking amplifier produces an output based on the input signal when the input voltage is above a first level illustrated at 390. For a sinusoidal signal, the peaking amplifier may be biased to output only a portion of the input signal, denoted by a phase angle "θ" (e.g., a phase of the input generating an output). However, as the output power is backed off from a maximum, the system may reduce the power supply voltage and the input voltage signal to the peaking amplifier. For the same bias voltage, BIAS1, a reduced input voltage signal 342 will result in a smaller portion of the input signal being coupled to the output (e.g., the phase angle "θ" is reduced) and the power amplifier will operate less efficiently. Accordingly, as the output power is reduced, corresponding reductions in the power supply voltage and input voltage can be compensated for by increasing the bias voltage from BIAS1 to BIAS2, for example, as shown at 340B. Here, input signal 342 is DC shifted up with a larger bias voltage at lower power supply voltages to maintain an approximately constant portion of the signal amplified at the output (e.g., the phase angle θ is maintained across variations in supply voltage).

FIG. 4 illustrates simulated performance curves for an example power amplifier according to one embodiment. Plots 401 and 402 show gain and PAE, respectively, across a range of output powers, Po, and supply voltages (denoted here, Vhigh) with static gate biasing of the peaking amplifier. Plots 403 and 404 show gain and PAE, respectively, across a range of output powers and supply voltages with dynamic gate biasing of the peaking amplifier as described herein. Plots 401 and 403 illustrate that the gain of the system is improved with dynamic gate biasing of the peaking amplifier. Likewise, plots 402 and 404 illustrate that the integrity of the Doherty peaks is improved with dynamic gate biasing of the peaking amplifier.

Figure 5:
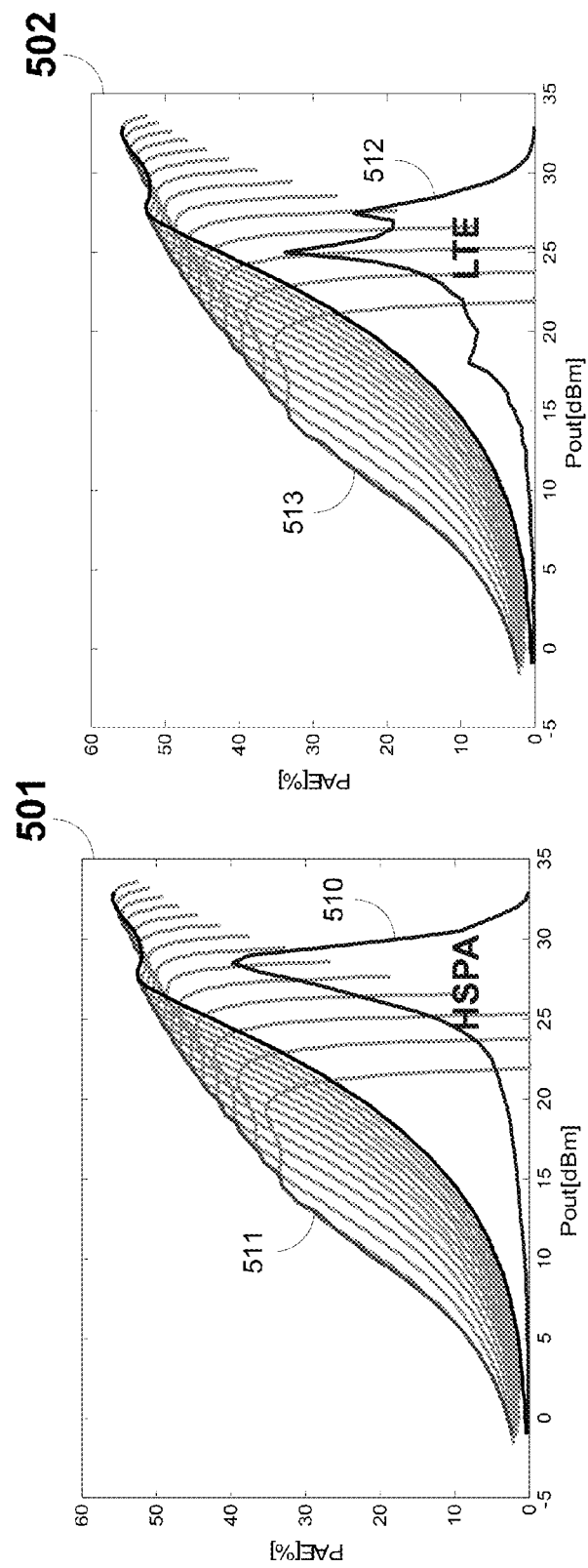
FIG. 5 illustrates simulated efficiency of a power amplifier with supply voltage modulation and dynamic biasing of the peaking amplifier according to one embodiment.

FIG. 5 illustrates simulated efficiency of a power amplifier with supply voltage modulation and dynamic biasing of the peaking amplifier according to one embodiment. This example illustrates PAE versus output power of one example configuration as applied to two different wireless protocols. Plot 501 shows amplifier efficiency applied to a high speed packed access (HSPA) protocol. Curve 510 shows a probability distribution function of an HSPA signal, which shows how often the signal is at a particular instantaneous power level given an average transmit power. Curve 511 shows an envelope of PAE of a Doherty power amplifier with dynamic biasing of the peaking stage as described herein, which exhibits high efficiency across the entire spectrum of the HSPA signal. Similarly, plot 502 shows amplifier efficiency applied to a long term evolution (LTE) protocol. Curve 512 shows a probability distribution function of an LTE signal, which shows how often the signal is at a particular instantaneous power level given an average transmit power. Curve 513 shows an envelope of PAE of a Doherty power amplifier with dynamic biasing of the peaking stage as described herein, which exhibits high efficiency across the entire spectrum of the LTE signal. It is to be understood that the techniques described herein may be applied to many other protocols and that the above examples are merely illustrative.

Figure 6:
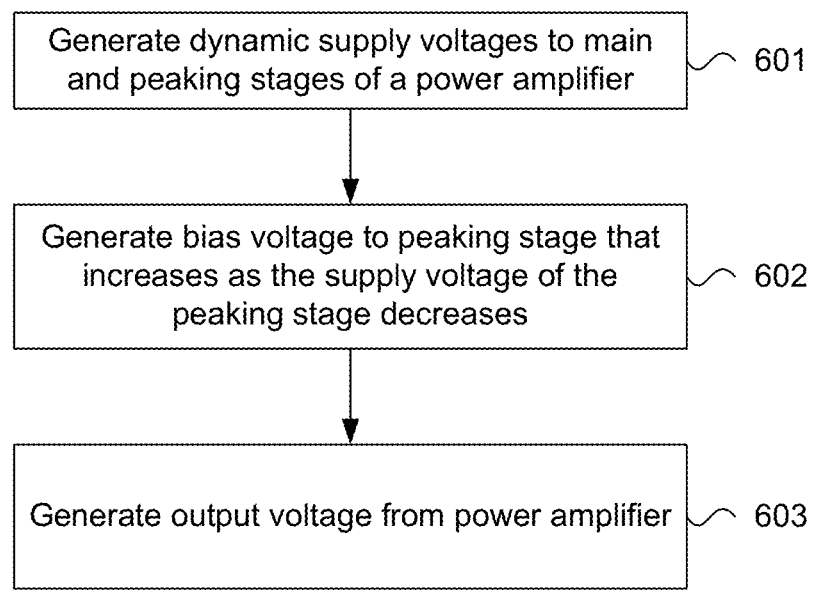
FIG. 6 illustrates a process for operating a power amplifier according to another embodiment.

FIG. 6 illustrates a process for operating a power amplifier according to another embodiment. At 601, dynamic supply voltages may be generated to a main amplifier stage and a peaking amplifier stage of a power amplifier. The power amplifier may be a Doherty power amplifier, for example. At 602, a bias voltage is generated to the peaking stage. The bias voltage may vary in accordance with variations in the power supply voltage to the peaking stage. The bias voltage to the peaking stage may increase as the supply voltage of the peaking stage decreases, for example, and the bias voltage to the peaking stage may decrease as the supply voltage of the peaking stage increases. At 603, an output signal (e.g., a voltage) may be generated from the power amplifier. An output terminal of the power amplifier may be coupled to an antenna to drive RF signals received by the power amplifier to the antenna for broadcasting on the airwaves.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A circuit comprising:
   a power amplifier comprising a main amplifier stage and a peaking amplifier stage, wherein an output of the peaking amplifier stage is coupled to an output of the main amplifier stage through an impedance inverter circuit, wherein the output of the peaking amplifier stage is coupled to an output terminal of the power amplifier, the power amplifier producing an output voltage on the output terminal, wherein the main amplifier stage comprises a first power supply terminal and the peaking amplifier stage comprises a second power supply terminal;

a power supply circuit coupled to the first power supply terminal and the second power supply terminal to provide one or more dynamic supply voltages to the main amplifier stage and to the peaking amplifier stage; and a bias circuit to bias the peaking amplifier stage comprising a subtractor circuit configured to output a difference between an input coupled to the second power supply terminal and a modulated reference voltage to bias the peaking amplifier stage.

2. A circuit comprising:

a power amplifier comprising a main amplifier stage and a peaking amplifier stage, wherein an output of the peaking amplifier stage is coupled to an output of the main amplifier stage through an impedance inverter circuit, wherein the output of the peaking amplifier stage is coupled to an output terminal of the power amplifier, the power amplifier producing an output voltage on the output terminal, wherein the main amplifier stage comprises a first power supply terminal and the peaking amplifier stage comprises a second power supply terminal;

a power supply circuit coupled to the first power supply terminal and the second power supply terminal to provide one or more dynamic supply voltages to the main amplifier stage and to the peaking amplifier stage; and a bias circuit comprising a subtractor circuit configured to bias the peaking amplifier stage based on a difference between a voltage on the second power supply terminal and a modulated reference voltage.

3. The circuit of claim 2 wherein the subtractor circuit comprises:

an amplifier having a first input, a second input, and an output, wherein the output of the amplifier is coupled through an inductor to an input of the peaking amplifier stage;

a first resistor coupled between the second power supply terminal and the first input of the amplifier;

a second resistor coupled between the output of the amplifier and the first input of the amplifier;

a third resistor coupled between a reference voltage and the second input of the amplifier; and a fourth resistor coupled between the second input of the amplifier and ground.

4. The circuit of claim 1 wherein the bias voltage increases linearly as the voltage on the second power supply terminal decreases.

5. The circuit of claim 1 wherein the bias voltage increases monotonically as the voltage on the second power supply terminal decreases.

6. The circuit of claim 1 wherein the peaking amplifier stage comprises a transistor having a control terminal coupled to receive an input voltage, a first terminal coupled to ground, and a second terminal coupled to the second power supply terminal through an inductor.

7. The circuit of claim 1 wherein the power amplifier is a Doherty power amplifier.

8. A method comprising:

generating an output voltage in a power amplifier, the power amplifier comprising a main amplifier stage and a peaking amplifier stage, wherein an output of the peaking amplifier stage is coupled to an output of the main amplifier stage through an impedance inverter circuit, wherein the output of the peaking amplifier stage is coupled to an output terminal of the power amplifier, wherein the main amplifier stage comprises a first power supply terminal and the peaking amplifier stage comprises a second power supply terminal;

generating one or more dynamic supply voltages in a power supply circuit, wherein the one or more dynamic supply voltages are coupled to the first power supply terminal of the main amplifier stage and the second power supply terminal of the peaking amplifier stage; and generating a bias voltage to bias the peaking amplifier stage, wherein the bias voltage increases as a voltage on the second power supply terminal decreases, wherein the bias voltage is generated in a bias circuit based on the voltage on the second power supply terminal, wherein a phase angle of a signal amplified at an output of the peaking amplifier stage is maintained across variations in the voltage on the second power supply terminal.

9. A method comprising:

generating an output voltage in a power amplifier, the power amplifier comprising a main amplifier stage and a peaking amplifier stage, wherein an output of the peaking amplifier stage is coupled to an output of the main amplifier stage through an impedance inverter circuit, wherein the output of the peaking amplifier stage is coupled to an output terminal of the power amplifier, wherein the main amplifier stage comprises a first power supply terminal and the peaking amplifier stage comprises a second power supply terminal;

generating one or more dynamic supply voltages in a power supply circuit, wherein the one or more dynamic supply voltages are coupled to the first power supply terminal of the main amplifier stage and the second power supply terminal of the peaking amplifier stage; and generating a bias voltage to bias the peaking amplifier stage, wherein the bias voltage increases as a voltage on the second power supply terminal decreases, wherein generating the bias voltage comprises subtracting a first voltage corresponding to the voltage on the second power supply terminal from a first reference voltage, and wherein the first reference voltage is modulated.

10. The method of claim 9 wherein said subtracting comprises:

coupling the voltage on the second power supply terminal to a first input of an amplifier through a first resistor, wherein an output of the amplifier is coupled to the first input through a second resistor and the output is coupled through an inductor to an input of the peaking amplifier stage; and coupling the first reference voltage through a third resistor to a second input of the amplifier, wherein the second input of the amplifier is coupled to ground through a fourth resistor.

11. The method of claim 8 wherein the bias voltage increases linearly as the voltage on the second power supply terminal decreases.

12. The method of claim 8 wherein the bias voltage increases monotonically as the voltage on the second power supply terminal decreases.

13. The method of claim 8 wherein the peaking amplifier stage comprises a transistor having a control terminal coupled to receive an input voltage, a first terminal coupled to ground, and a second terminal coupled to the second power supply terminal through an inductor.

14. The method of claim 8 wherein the power amplifier is a Doherty power amplifier.

15. The circuit of claim 1 wherein a phase angle of a signal amplified at an output of the peaking amplifier stage is maintained across variations in the voltage on the second power supply terminal.

16. The circuit of claim 2 wherein the bias voltage increases linearly as the voltage on the second power supply terminal decreases.

17. The circuit of claim 2 wherein the bias voltage increases monotonically as the voltage on the second power supply terminal decreases.

18. The circuit of claim 2 wherein the peaking amplifier stage comprises a transistor having a control terminal coupled to receive an input voltage, a first terminal coupled to ground, and a second terminal coupled to the second power supply terminal through an inductor.

19. The circuit of claim 2 wherein the power amplifier is a Doherty power amplifier.

20. The circuit of claim 2 wherein a phase angle of a signal amplified at an output of the peaking amplifier stage is maintained across variations in the voltage on the second power supply terminal.

21. The method of claim 8 wherein a phase angle of a signal amplified at an output of the peaking amplifier stage is maintained across variations in the voltage on the second power supply terminal.

22. The method of claim 9 wherein the bias voltage increases linearly as the voltage on the second power supply terminal decreases.

23. The method of claim 9 wherein the bias voltage increases monotonically as the voltage on the second power supply terminal decreases.

24. The method of claim 9 wherein the peaking amplifier stage comprises a transistor having a control terminal coupled to receive an input voltage, a first terminal coupled to ground, and a second terminal coupled to the second power supply terminal through an inductor.

25. The method of claim 9 wherein the power amplifier is a Doherty power amplifier.

26. The method of claim 9 wherein a phase angle of a signal amplified at an output of the peaking amplifier stage is maintained across variations in the voltage on the second power supply terminal.

* * * * *